(12) United States Patent
Shibuya et al.

(10) Patent No.: US 8,621,730 B2
(45) Date of Patent: Jan. 7, 2014

(54) CAPACITOR PRODUCING METHOD FOR PRODUCING THIN-FILM CAPACITORS ELIMINATING DEFECTS

(75) Inventors: Akinobu Shibuya, Tokyo (JP); Koichi Takemura, Tokyo (JP); Takashi Manako, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 13/203,018

(22) PCT Filed: Feb. 12, 2010

(86) PCT No.: PCT/JP2010/000853
§ 371 (c)(1),
(2), (4) Date: Aug. 24, 2011

(87) PCT Pub. No.: WO2010/098026
PCT Pub. Date: Sep. 2, 2010

(65) Prior Publication Data
US 2011/0302753 A1 Dec. 15, 2011

(30) Foreign Application Priority Data
Feb. 25, 2009 (JP) ................................. 2009-042210

(51) Int. Cl.
*H01G 7/00* (2006.01)
(52) U.S. Cl.
USPC .......................... 29/25.42; 29/25.41; 438/239
(58) Field of Classification Search
USPC ................. 29/25.35–25.42, 592.1, 846–847; 361/306.3, 321.4, 305, 306.2; 438/250–253, 396–399, 239, 689; 257/295, 310, 21.009 E
See application file for complete search history.

(56) References Cited

U.S. PATENT DOCUMENTS

| | | | |
|---|---|---|---|
| 3,402,448 A * | 9/1968 | Heath | 29/25.42 |
| 3,649,488 A * | 3/1972 | Pitetti et al. | 205/646 |
| 4,749,454 A * | 6/1988 | Arya et al. | 438/4 |
| 5,817,533 A * | 10/1998 | Sen et al. | 438/4 |
| 6,528,369 B1 * | 3/2003 | Ema | 438/254 |
| 6,993,814 B2 * | 2/2006 | Adler | 29/25.42 |
| 2009/0020849 A1 | 1/2009 | Smith et al. | |

FOREIGN PATENT DOCUMENTS

| | | |
|---|---|---|
| JP | 10-200071 A | 7/1998 |
| JP | 11-154734 A | 6/1999 |
| JP | 2001-338836 A | 12/2001 |
| JP | 2002-008942 A | 1/2002 |
| JP | 2003-060041 A | 2/2003 |

(Continued)

OTHER PUBLICATIONS

International Search Report of PCT/JP2010/000853 dated May 18, 2010.

(Continued)

*Primary Examiner* — Minh Trinh
(74) *Attorney, Agent, or Firm* — Sughrue Mion, PLLC (57) ABSTRACT

In a capacitor producing method, a bottom electrode, a thin-film dielectric, and a top electrode are deposited on a substrate so as to form a capacitor, wherein defects including particles and electrical short-circuits between the bottom electrode and the top electrode are detected before the capacitor is divided into capacitor cells. Next, defects such as particles and electrical short-circuits between the bottom electrode and the top electrode are removed before the capacitor is divided into capacitor cells.

8 Claims, 12 Drawing Sheets

(56) References Cited

FOREIGN PATENT DOCUMENTS

| | | |
|---|---|---|
| JP | 2003-069185 A | 3/2003 |
| JP | 3465464 A | 8/2003 |
| JP | 2005-033195 A | 2/2005 |
| JP | 2005-123250 A | 5/2005 |
| JP | 2006-253631 A | 9/2006 |
| JP | 2007-206444 A | 8/2007 |
| JP | 2007-281376 A | 10/2007 |
| JP | 2008-041757 A | 2/2008 |
| JP | 2008-164881 A | 7/2008 |

OTHER PUBLICATIONS

Office Action, dated Jul. 26, 2013, issued by the State Intellectual Property Office of the People's Republic of China, in counterpart Application No. 201080008852.5.

* cited by examiner

FIG. 15 ical Field

The present invention relates to capacitor producing methods for producing thin-film capacitors, capacitor producing devices, capacitor producing programs and recording media.

BACKGROUND ART

Printed circuit boards mounting semiconductor elements are fabricated with numerous capacitors on the periphery of each LSI (Large Scale Integration) chip to prevent noise. When a rapid load i is imparted to an LSI chip due to a clock operation, a voltage drop ΔV occurs owing to resistance R and inductance L, which exist in lines between the power source and the LSI chip, in accordance with Equation (1) as follows.

$$\Delta V = R \times i - L \times di/dt \quad (1)$$

The reason why the sign of L is minus (−) is that an induced electromotive force occurs to cancel out a current instantly occurred. Therefore, the voltage drop ΔV increases as R and L of lines and a load fluctuation di increase, or as a varying time dt decreases. Recently, LSI chips have advanced so that they can operate at high-speed clock frequencies, which exceed several hundreds Mega-hertz. That is, the voltage drop ΔV increases when a rise time tr decreases as the clock frequency increases since the rise time tr of a pulse waveform in a digital circuit is equivalent to the load varying time dt.

As a measure to reduce the voltage drop ΔV, it is an effective measure to juxtapose capacitors between the power line and the ground line of an LSI chip. These capacitors are generally called decoupling capacitors. Since an increased clock frequency of an LSI chip makes it difficult to timely compensate for a temporary voltage drop due to load fluctuation by way of the power source, decoupling capacitors, juxtaposed with an LSI chip, are used to supply electric charge so as to compensate for a voltage drop of the LSI chip. However, ΔV according to Equation (1) has still occurred under influences of equivalent series resistance (ESR) and equivalent series inductance (ESL) of capacitors, wiring resistance R and wiring inductance L between each capacitor and each LSI chip.

Figure 15:
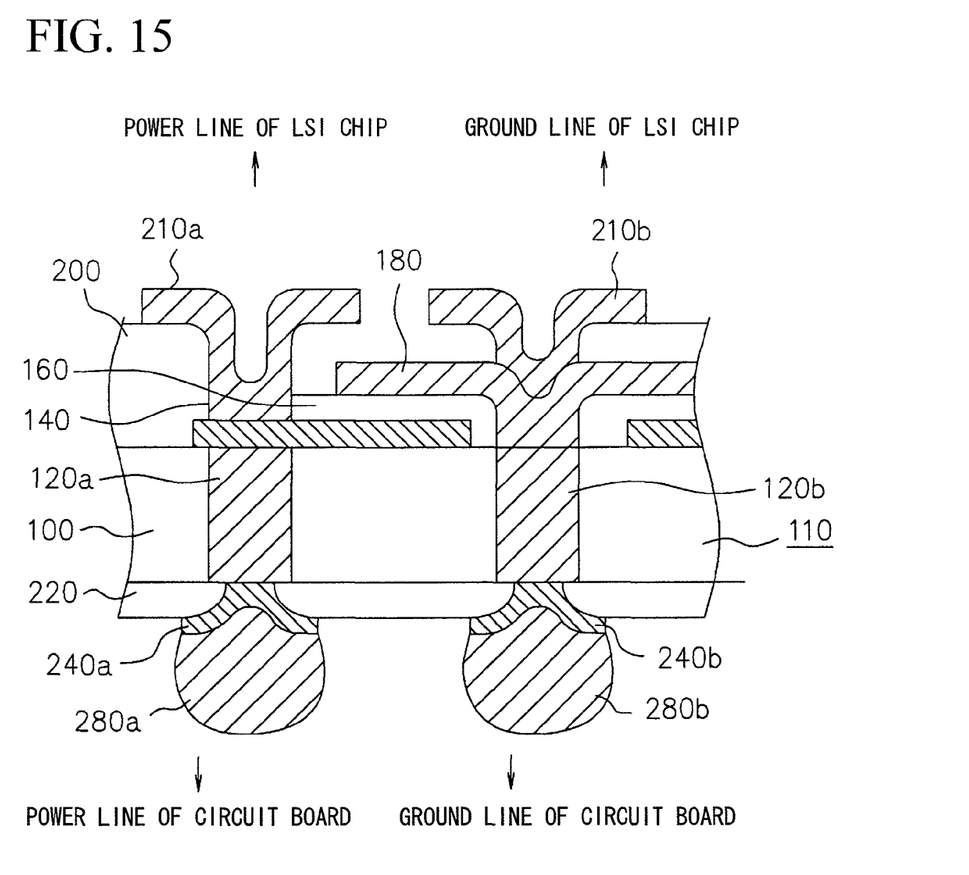
[FIG. 15] A cross-sectional view of a conventionally-known capacitor structure.

Recently, high clock frequencies increased in the GHz order leads to a problem in that inductance L of wiring between decoupling capacitors and an LSI chip cannot be ignored. To solve this problem, some documents (e.g. Patent Documents 1 to 6) disclose interposer capacitors as techniques of reducing L. FIG. 15 shows the structure of an interposer capacitor disclosed in Patent Document 3.

In FIG. 15, a silicon substrate 100 includes a first through-hole 120a whose inside space is filled with a conductor. On a support member 110 composed of the substrate 100, a bottom electrode 140, a high dielectric film 160, and a top electrode 180 are laminated together to form a capacitor. The bottom electrode 140 of the capacitor is connected to an electrode pad 240a and a bump electrode 280a via the conductor of the through-hole 120a. The bump electrode 280a is connected to a power line of a circuit board. Additionally, the bottom electrode 140 is connected to a power line of an LSI chip via an electrode pad 210a. The top electrode 180 of the capacitor is connected to an electrode pad 240b and a bump electrode 280b via a conductor filled in the inside space of a through-hole 120b. The bump electrode 280b is connected to a ground line of the circuit board. Additionally, the top electrode 180 is connected to the ground line of the LSI chip via an electrode pad 210b. The electrode pads 210a, 210b, 240a, 240b are formed on protective films 200 and 220.

Capacitors with the μF order of high capacitance, which meet the GHz order of high-speed processing of LSI chips, need large areas equivalent to areas of LSI chips; however, a problem arises owing to difficulty in forming large-area capacitors using thin films. This is because large-area capacitors, equivalent to the size of an LSI chip, suffer from a problem in that short-circuits may occur due to defects of dielectric films when particles occur in deposition processes. To solve this problem, some documents (e.g. Patent Document 7) disclose specific techniques regarding capacitors whose dielectric layers are composed of anodic oxidation films easily facilitating large-area capacitors. However, another problem arises in the technique of Patent Document 7 in that capacitance of capacitors cannot be increased due to a small dielectric constant of an anodic oxidation film than a dielectric constant of an oxidation thin film having a perovskite structure.

As the method of detecting defects in wires and diffused layers of semiconductor devices, some documents (e.g. Patent Document 8) disclose a method of measuring resistance variation, wherein they refer to the actual utilization of OBIRCH (Optical Beam Induced Resistance Change) analysis. OBIRCH analysis has been used for defects analysis on semiconductor devices and finished products of capacitors, whereas it can be used to detect short-circuits between top electrodes and bottom electrodes of capacitors.

PRIOR ART DOCUMENT

Patent Document

Patent Document 1: Japanese Patent Application Publication No. 2005-33195
Patent Document 2: Japanese Patent Application Publication No. 2001-338836
Patent Document 3: Japanese Patent Application Publication No. 2002-8942
Patent Document 4: Japanese Patent Application Publication No. 2006-253631
Patent Document 5: Japanese Patent Application Publication No. 2005-123250
Patent Document 6: Japanese Patent No. 3465464
Patent Document 7: Japanese Patent Application Publication No. 2003-069185
Patent Document 8: Japanese Patent Application Publication No. 2008-041757

SUMMARY OF THE INVENTION

Problem to be Solved by the Invention

However, the technologies of Patent Documents 1 to 8 suffer from a problem in that the defects occurrence frequency increases due to the formation of large-area thin-film capacitors. On the other hand, another problem arises in that capacitors whose dielectric materials are composed of anodic oxidation films cannot achieve high capacitance due to low dielectric constants. Additionally, no method is provided to repair capacitors during production.

The present invention is made in consideration of the foregoing circumstances, wherein the object thereof is to solve the foregoing problems and to provide a capacitor producing method for producing thin-film capacitors with a good production yield, a capacitor producing device, a program and a recording medium.

Means for Solving the Problem

A capacitor producing method of the present invention includes a deposition process for forming a capacitor composed of a bottom electrode, a thin-film dielectric, and a top electrode deposited on a substrate, a defect detecting process for detecting defects, including particles and electrical short-circuits between the bottom electrode and the top electrode, before dividing the capacitor into capacitor cells, and a defect removing process for removing defects.

A capacitor producing device of the present invention includes a defect detecting unit for detecting defects of a capacitor before divided into capacitor cells and a defect removing unit for removing defects, wherein the capacitor is composed of a substrate, a bottom electrode, a thin-film dielectric, and a top electrode, and wherein defects include particles and electrical short-circuits between the bottom electrode and the top electrode.

A program of the present invention causes a computer to implement a deposition process for forming capacitor composed of a bottom electrode, a thin-film dielectric, and a top electrode deposited on a substrate, and a process for detecting defects, including particles and electrical short-circuits between the bottom electrode and the top electrode, before dividing the capacitor into capacitor cells, and a process for removing defects.

A recording medium of the present invention is a computer-readable recording medium storing the aforementioned program.

Effect of the Invention

According to the present invention, it is possible to produce thin-film capacitors with a good production yield.

MODE FOR CARRYING OUT THE INVENTION

Hereinafter, various embodiments of the present invention will be described in detail with reference to the drawings. Herein, the same elements are designated by the same reference numerals; hence, descriptions thereof will be omitted here.

(Embodiment 1)

Figure 1:
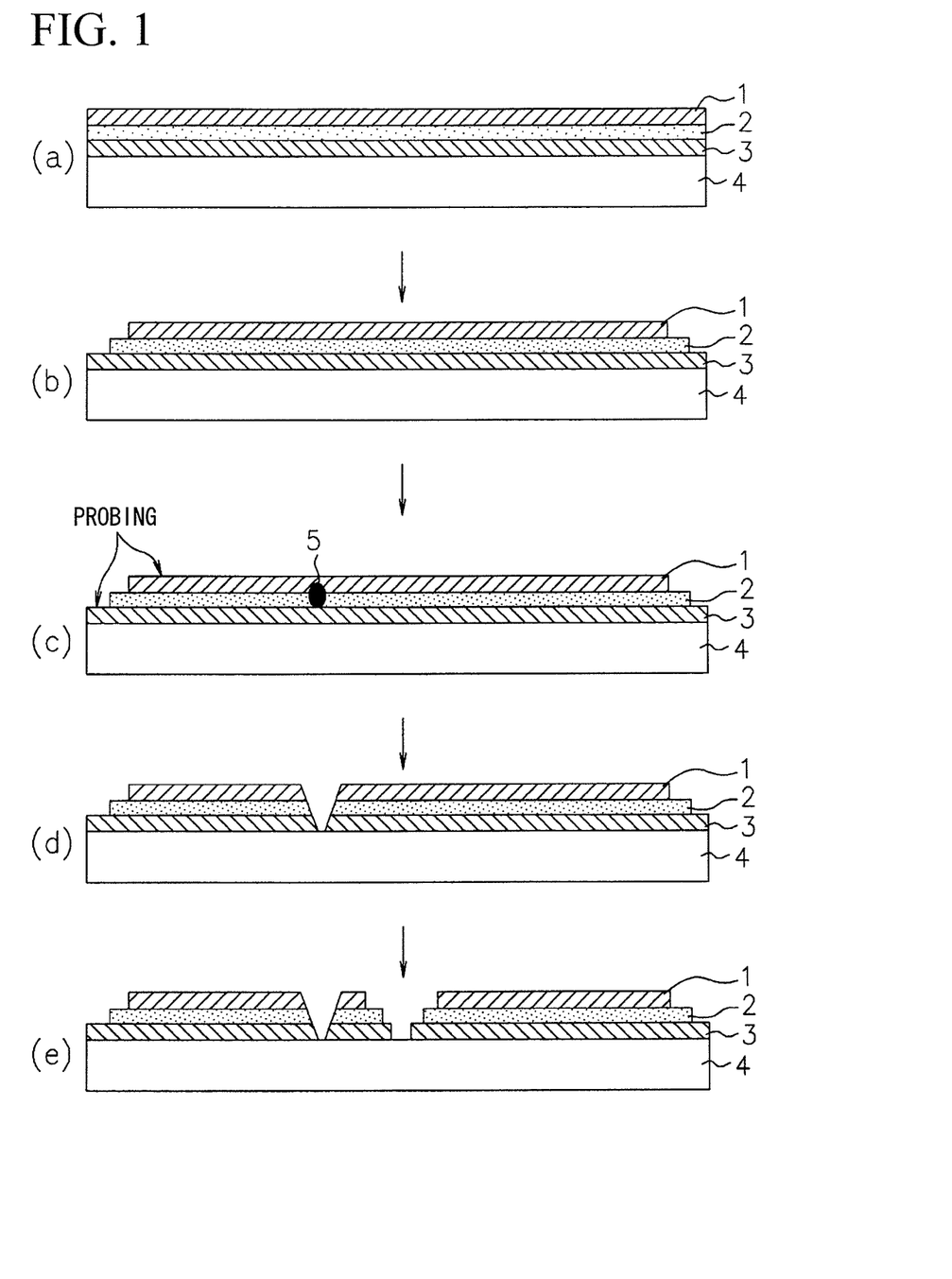
[FIG. 1] Cross-sectional views illustrating a capacitor producing method according to Embodiment 1 of the present invention.

FIG. 1 illustrates a method for producing a thin-film capacitor according to Embodiment 1 of the present invention. In this illustration, the thin-film capacitor of the present embodiment includes a top electrode 1, a thin-film dielectric 2, a bottom electrode 3, and a substrate 4. For instance, it is preferable that material of the top electrode 1 be selected from among Pt, Ru, TiN and Au. However, the top electrode is not restricted to these materials.

For instance, it is preferable that the material of the thin-film dielectric 2 be selected from compounds including a perovskite structure with a high dielectric constant. As a compound including a perovskite structure, it is preferable to employ a composite perovskite compound, having an average valence of two in an A site, in which a Pb, Ba site (A site) is partly replaced with Sr, Ca or La in a skeletal structure composed of SiTiO3, (Sr, Ba)TiO3 partly replacing Sr with Ba in SrTiO3, PbTiO3, or BaTiO3. Additionally, it is possible to employ a composite perovskite compound, having an average valence of four in a B site, in which Ti (B site) is partly replaced with Mg, W, Nb, Zr, Ni or Zn in the foregoing compound. However, material of the thin-film dielectric 2 is not necessarily limited to these materials. A producing method of the thin-film dielectric 2 is not necessarily limited to a specific method, wherein it is preferable to adopt a sputtering method, a CVD (Chemical Vapor Deposition) method, or a sol-gel method.

It is preferable that material of the bottom electrode 3 be selected from among metals or alloys with a high adhesion with the substrate 4 and with a low diffusion into the thin-film dielectric 2. For instance, it is preferable to sequentially deposit active metals such as Ti, Cr, Ta, and Mo or high-barrier metals such as Pt, Ru, TiN, Au on an insulating substrate. However, the material is not restricted thereto.

Preferably, the substrate 4 should be composed of a substrate with a high surface fineness facilitating deposition of a thin-film capacitor. It is preferable to employ a semiconductor substrate composed of Si, GaAs or an insulating substrate composed of sapphire, ceramic, or resins. When the substrate 4 is made using a semiconductor substrate composed of Si, and GaAs, it is preferable to form an insulating layer on the surface of the substrate 4.

The present embodiment will be described with respect to a method of producing a thin-film capacitor with reference to FIG. 1. First, as shown in FIG. 1(a), the bottom electrode 3, the thin-film dielectric 2, and the top electrode 1, which are assembled into an MIM (Metal Insulation Metal) structure, are deposited on the substrate 4. Next, as shown in FIG. 1(c), it is determined whether or not a particle 5 or a defect, such as electrical short-circuit between the top electrode 1 and the bottom electrode 3, exists on the entire surface of a wafer. Detection methods are not specifically limited, but OBIRCH or the like is preferable. Optical detection can be adopted on particles; however, as a detection method of electrical short-circuit, it is preferable to employ a resistance variation measuring method using laser scanning with OBIRCH analysis or the like. As show in FIG. 1(b), an exposed portion of the bottom electrode 3 needs to be formed at an edge of a wafer for the purpose of probing in resistance measurement.

Next, as shown in FIG. 1(d), the particle 5 or a defect such as electrical short-circuit between the top electrode 1 and the bottom electrode 3, which is specified in the process of FIG. 1(c), is locally removed from the wafer. Removing methods are not specifically limited, but it is possible to employ laser, ion beam, electron beams, and wet etching as well as mechanical processing such as drilling and sand-blasting. Particularly, it is preferable to employ laser processing. Through the foregoing processes, it is possible to produce the capacitor shown in FIG. 1(e).

Figure 2:
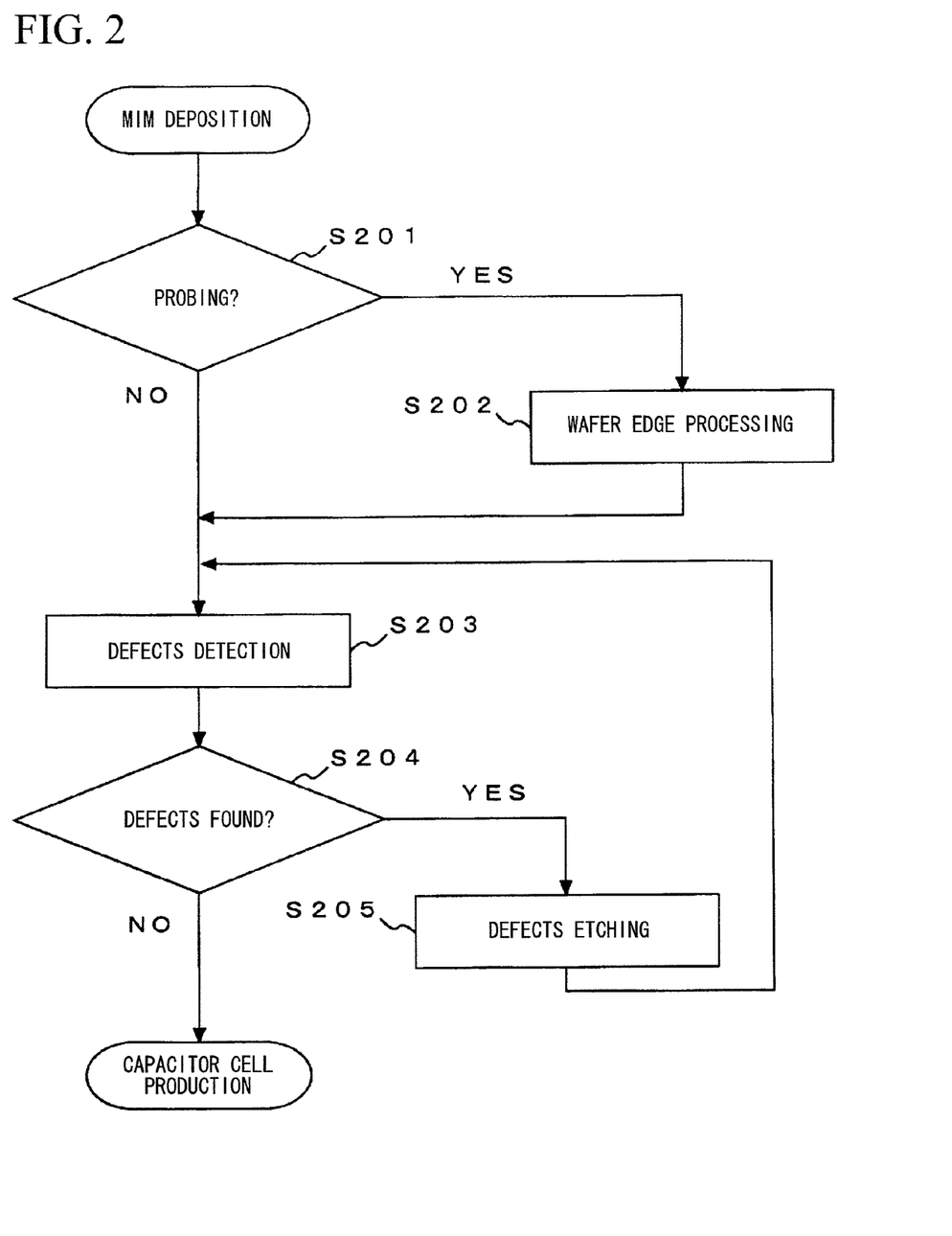
[FIG. 2] A flowchart illustrating the capacitor producing method according to Embodiment 1 of the present invention.

Local removal of a defect shown in FIG. 1(d) will be described with reference to FIG. 2. FIG. 2 shows a method of producing a thin-film capacitor of the present invention.

In the MIM deposition processing shown in FIG. 2, a decision is made as to whether or not probing needs to be performed (step S201). In order to perform probing (YES in step S201), a wafer edge is processed to expose the bottom electrode 3 (step S202). When probing is not needed (NO in step S201), or after the wafer edge is processed in step S202, an inspection is performed to detect defects in capacitors (step S203). For instance, defects of capacitors are detected in accordance with a resistance variation measurement technique adopting laser scanning such as OBIRCH analysis.

Next, a decision is made as to whether or not defects are included in capacitors based on the detection result of step S203 (step S204). When defects are found in capacitors (YES in step S204), defects are locally removed via etching (step S205). After that, the flow proceeds to step S203; subsequently, the foregoing steps S203 to S205 are repeated until no defect is left in capacitors. On the other hand, when no defect is found in capacitors (NO in step S204), the flow proceeds to capacitor cell production.

Figure 3:
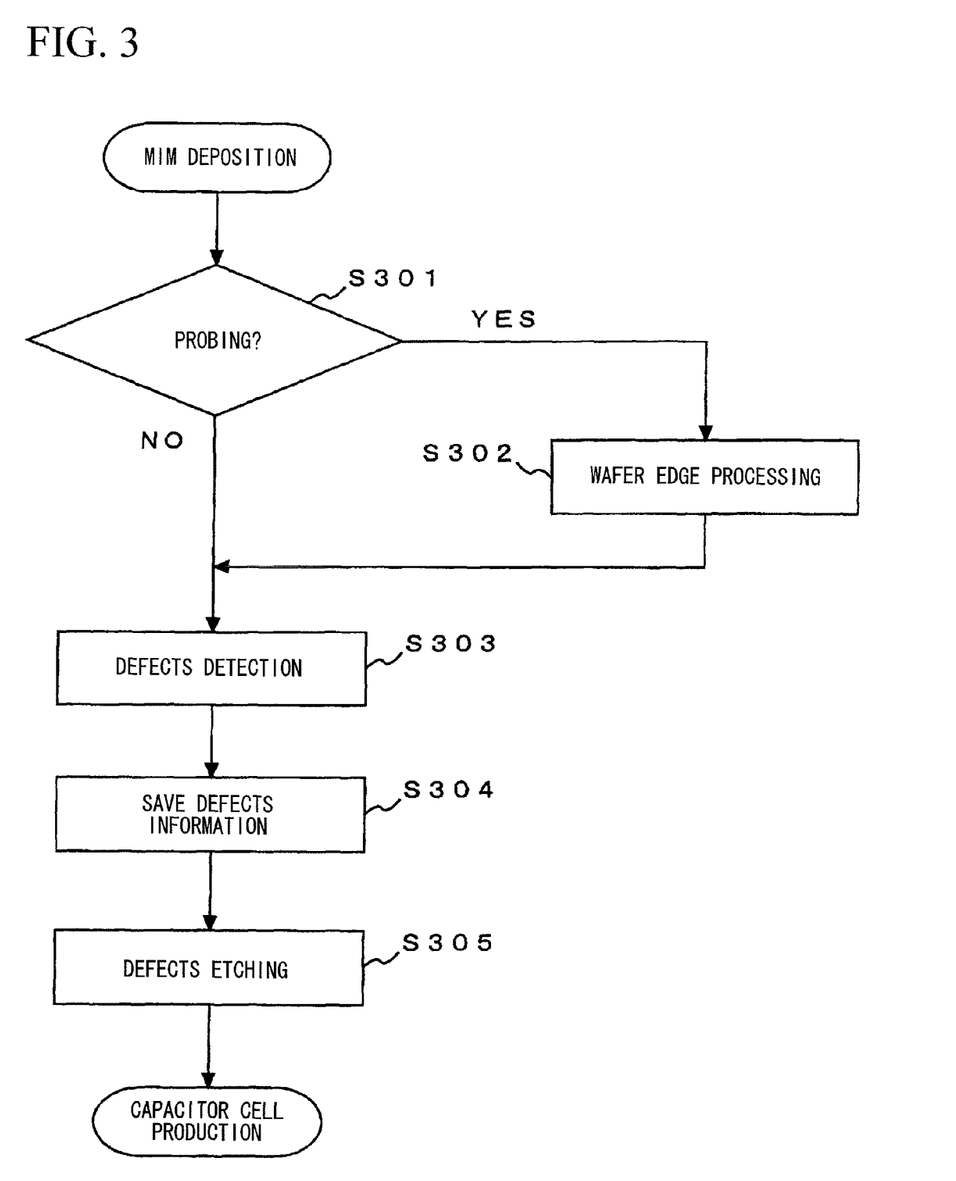
[FIG. 3] A flowchart illustrating the capacitor producing method according to Embodiment 1 of the present invention.

The foregoing description refers to an example of local removal processing for locally removing defects from capacitors, in which the local removal processing is carried out every time defects are detected in capacitors. FIG. 3 shows another method in which detected defects are temporarily stored in memory, and then all the defects stored in memory are collectively subjected to the local removal processing.

In the MIM deposition processing shown in FIG. 3, a decision is made as to whether or not probing needs to be performed (step S301). In order to perform probing (YES in step S301), a wafer edge is processed to expose the bottom electrode 3 (step S302). When probing is not needed (NO in step S301), or after the wafer edge is processed in step S302, an inspection is performed to detect defects in capacitors. For instance, defects of capacitors are detected in accordance with a resistance variation measurement method adopting laser scanning such as OBIRCH. The defect detection of step S303 differs from the foregoing defect detection of step S202 in that all the defects included in capacitors are collectively detected, so that defects information representing positional data of defects is saved in the memory (step S304).

After completion of the defect detection of step S303, defects are locally removed via etching (step S305) based on the defects information, which is saved in memory in step S304. Subsequently, the flow proceeds to capacitor cell production.

The present embodiment makes it possible to locally remove defects, whereby capacitors, whose defects have been already removed, are formed at desired positions, so that it is possible to form non-defective capacitors. Even when defects such as short-circuits remain on a wafer after MIM deposition, it is possible to locally remove those defects before capacitors are divided into capacitor cells, whereby it is possible to produce thin-film capacitors at a good production yield in the subsequent formation of capacitor cells.

(Embodiment 2)

Figure 4:
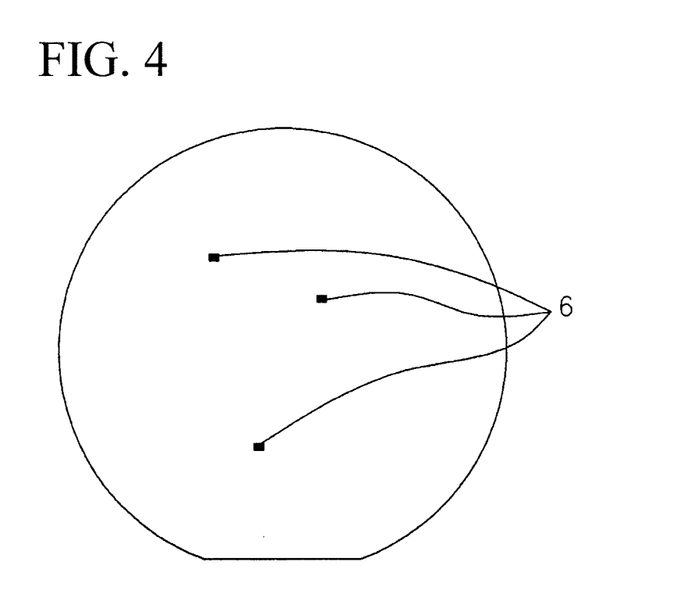
[FIG. 4] A plan view showing an example of defect analysis on a wafer after deposition of MIM on a capacitor according to Embodiment 2 of the present invention.
Figure 5:
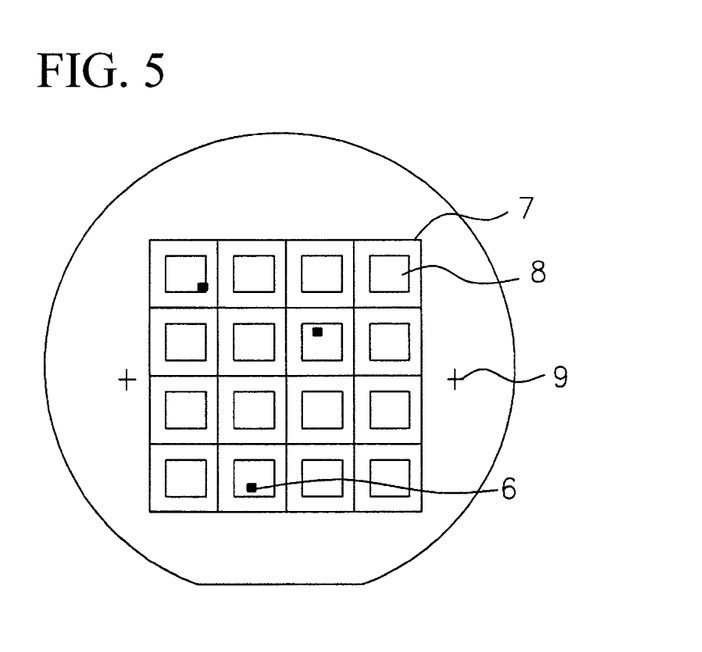
[FIG. 5] A plan view showing an exemplary formation of capacitor cells according to Embodiment 2 of the present invention.
Figure 6:
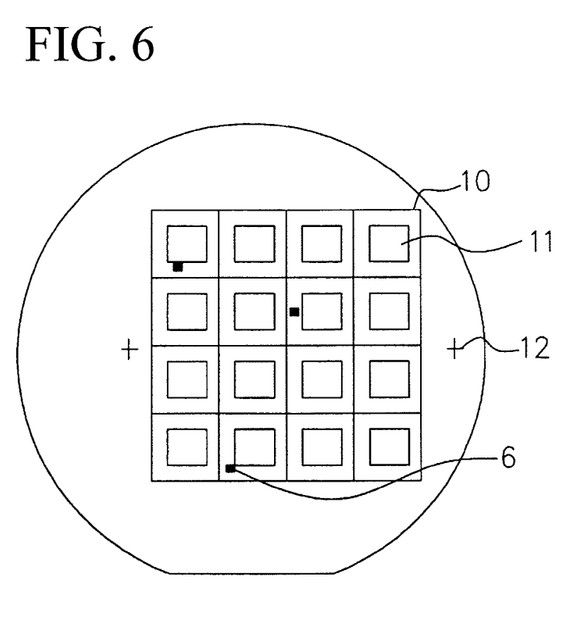
[FIG. 6] A plan view showing an exemplary formation of capacitor cells according to Embodiment 2 of the present invention.

FIG. 4 shows an example of defects analysis on a wafer with a thin-film capacitor subjected to MIM deposition according to Embodiment 2 of the present invention. FIGS. 5 and 6 show exemplary layouts for forming thin-film capacitors in accordance with the present embodiment.

Figure 7:
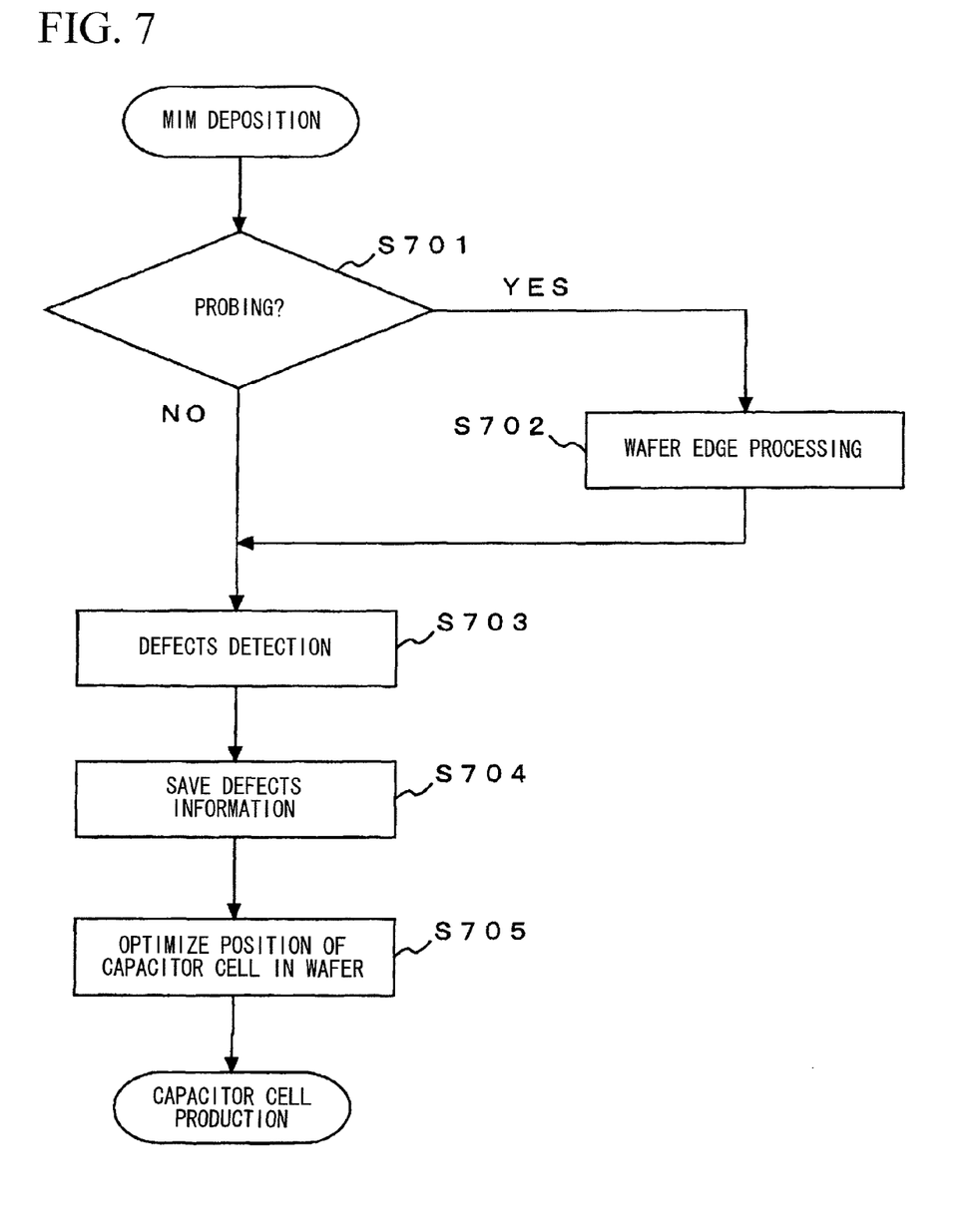
[FIG. 7] A flowchart illustrating a capacitor producing method according to Embodiment 2 of the present invention.

FIG. 7 shows a method of producing thin-film capacitors according to the present embodiment. Next, the method of producing thin-film capacitors according to the present embodiment will be described with reference to FIGS. 4 to 7.

FIG. 4 shows an MIM capacitor formed on the entire surface of a wafer, in which electrical short-circuits 6 are detected between the top electrode 1 and the bottom electrode 3. FIG. 5 shows positioning of capacitor cells produced using a mask, whose center is placed to match the center of a wafer having the MIM capacitor shown in FIG. 4 with reference to a predetermined position 9 for forming an alignment mark. In this figure, the short-circuits 6 are detected inside predetermined positions 8 for forming capacitor cells surrounded by capacitor-chip peripheral positions 7, and they act as defectiveness after formation of capacitor cells.

For this reason, the method of producing thin-film capacitors according to the present embodiment is designed to optimize positions of capacitor cells formed based on positions of the short-circuits 6 detected in FIG. 4, whereby capacitor cells are produced using a mask which is placed to match optimized positions thereof.

FIG. 6 shows an exemplary layout for forming capacitor cells using a mask which is placed to match optimized positions. Unlike the layout of FIG. 5, capacitor cells are formed using a mask which is placed to match optimized positions with reference to an alignment mark 12, wherein none of the short-circuits 6 exists in modified capacitor-cell forming positions 11. The present embodiment is described such that none of the short-circuits 6 exist in the capacitor-cell forming positions 11 (or capacitor cells) surrounded by capacitor-chip peripheral positions 10 after optimization of the positioning of a mask. Even when short-circuits remain in capacitor-cell forming positions, it is possible to reduce (minimize) the number of short-circuits left in capacitor cells; hence, it is possible to improve a yield in producing capacitors. In the foregoing capacitor producing method, it is effective to form the alignment mark 12, which makes it possible to easily adjust the positioning of a mask after optimization.

The foregoing capacitor producing method will be further described with reference to FIG. 7. In the MIM deposition, a decision is made as to whether or not probing needs to be performed (step S701). In order to perform probing (YES in step S701), a wafer edge is processed to expose the bottom electrode 3 (step S702). When probing is not needed (NO in step S701), or after the wafer edge is processed in step S702, an inspection is performed to detect defects in capacitors (step S703), so that defects information representing positional data of detected defects is saved in memory (step S704). For instance, defects of capacitors are detected in step S703 in accordance with a resistance variation measurement method adopting laser scanning such as OBIRCH analysis.

After completion of defect detection in step S703, positions of capacitor cells are optimized in a wafer (step S705) so that no defect will exist in capacitor cells. Then, the flow proceeds to capacitor cell production.

That present embodiment is designed to specify defects after MIM deposition on a wafer and to thereby optimize positions of capacitor cells, i.e. positions at which capacitor cells are to be formed, thus making it possible to form non-defective capacitors. Thus, it is possible to improve a yield in producing thin-film capacitor cells.

(Embodiment 3)

Figure 8:
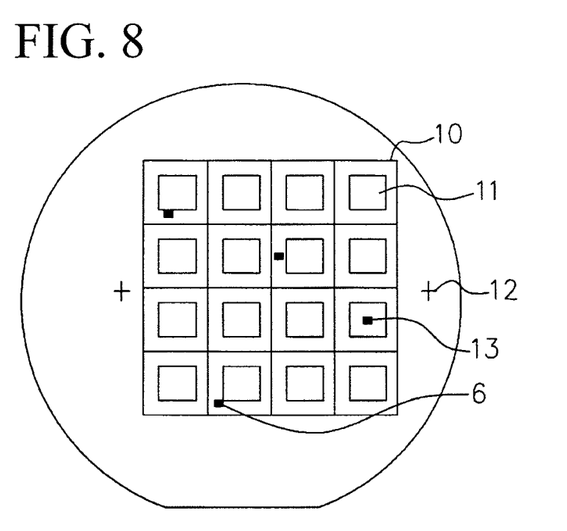
[FIG. 8] A plan view showing an exemplary formation of capacitor cells according to Embodiment 3 of the present invention.
Figure 9:
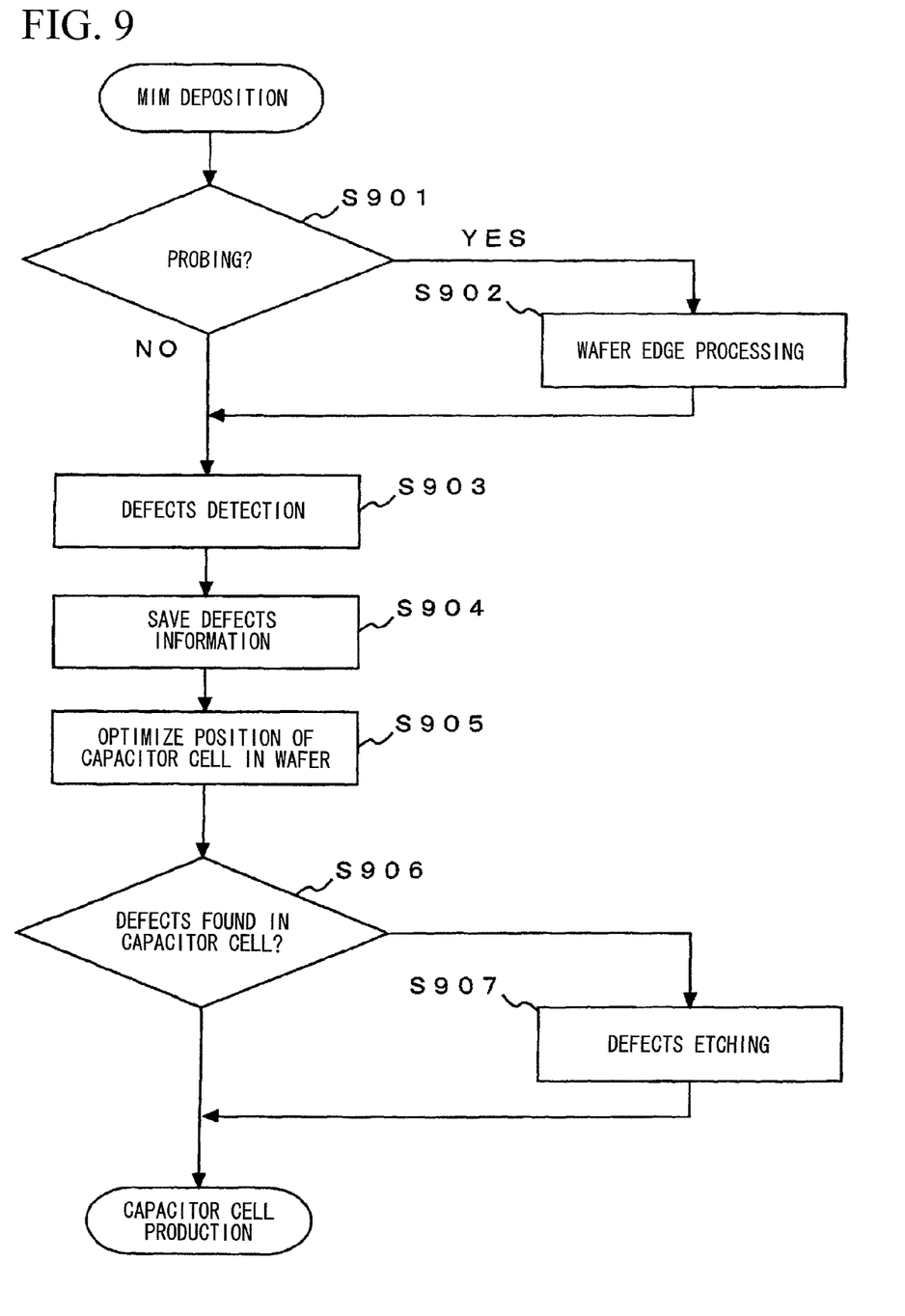
[FIG. 9] A flowchart showing a capacitor producing method according to Embodiment 3 of the present invention.

FIG. 8 shows Embodiment 3 of the present invention. FIG. 8 shows an example in which short-circuits still remain in capacitor cells after optimization of the positioning of a mask based on optimized positions of capacitor cells like Embodiment 2. FIG. 9 shows a capacitor producing method adapted to the situation of FIG. 8. The capacitor producing method, adapted to the situation in which defects still remain in capacitor-cell forming positions irrespective of optimization of the positioning of a mask, will be described with reference to FIGS. 8 and 9.

In the MIM deposition, a decision is made as to whether or not probing needs to be performed (step S901). In order to perform probing (YES in step S901), a wafer edge is processed to expose the bottom electrode 3 (step S902). When probing is not needed (NO in step S901), or after the wafer edge is processed in step S902, an inspection is made to detects defects in capacitors (step S903), so that defects information representing positional data of detected defects is saved in memory (step S904). In step S903, defects of capacitors are detected in accordance with a resistance variation measurement method adopting laser scanning such OBIRCH analysis.

After completion of defects detection in step S903, positions of capacitor cells are optimized in a wafer (step S905) based on the defects information, which is saved in memory in step S904, such that practically no defect will exist in capacitor cells or such that the number of defects will decrease.

Next, a decision is made as to whether or not defects remain in capacitor-cell forming positions (step S906). When defects are found in capacitor cells (YES in step S906), defects are locally removed by etching (step S907). FIG. 8 shows a defect 13 which will be removed by etching. Thereafter, the flow proceeds to capacitor cell production. On the other hand, when no defect is found in capacitor cells (NO in step S906), the flow proceeds to capacitor cell production as similar to Embodiment 2. Thus, it is possible to eliminate defective capacitor cells since partial removal of short-circuits shown in FIG. 1 is performed with respect to the internal areas of capacitor cells.

The present embodiment is designed to specify defects on a wafer after the MIM deposition, optimize positions of capacitor cells, and remove defects still left in capacitor cells after optimization of positions of capacitor cells, whereby it is possible to form non-defective capacitors with ease. Thus, it is possible to improve a yield in producing thin-film capacitors.

(Embodiment 4)

Figure 10:
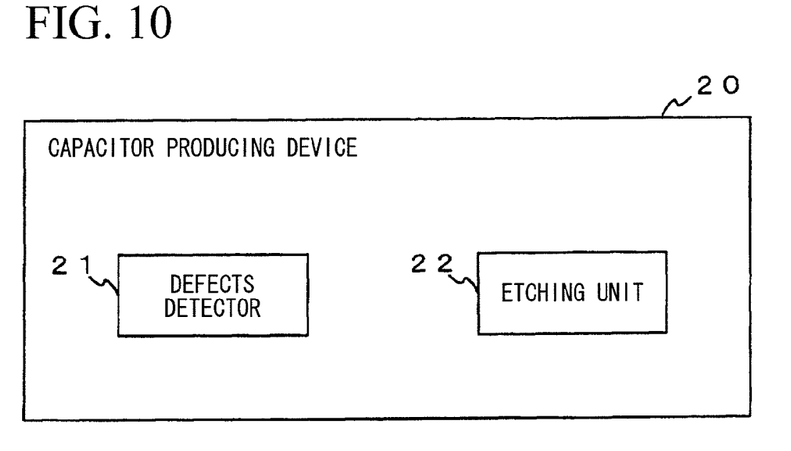
[FIG. 10] a block diagram of a capacitor producing device according to Embodiment 4 of the present invention.
Figure 11:
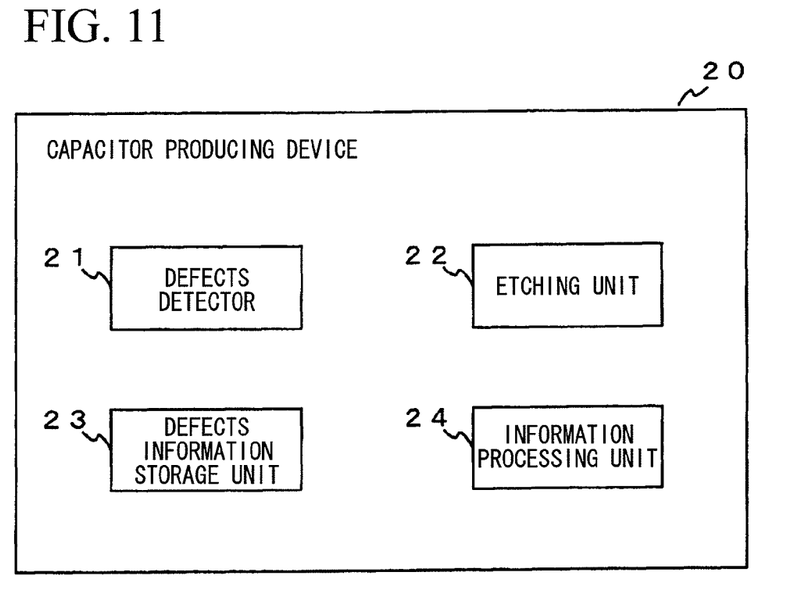
[FIG. 11] A block diagram of another capacitor producing device according to Embodiment 4 of the present invention.

Next, a capacitor producing method according to Embodiment 4 of the present invention will be described. FIGS. 10 and 11 show configurations of capacitor producing devices according to the present embodiment. FIG. 10 shows a capacitor producing device 20 of the present embodiment including a defects detector 21 and an etching unit 22. The defects detector 21 detects defects such as short-circuits and particles. The etching unit 22 is a defect removal unit that removes defects, which are detected by the defects detector 21, by local etching. As described above, the capacitor producing device 20 of the present embodiment is a device equipped with a defects detector and a defects removal unit.

The capacitor producing device 20 shown in FIG. 11 further includes a defects information storage unit 23 and an information processing unit 24 in addition to the constituent elements of the capacitor producing device shown in FIG. 10. The defects information storage unit 23 stores information representing positional data of defects detected by the defects detector 21. The information processing unit 24 optimizes capacitor forming positions based on defects information stored in the defects information storage unit 23. In the capacitor producing device 20 shown in FIG. 11, all pieces of defects information detected by the defects detector 21 are temporarily stored in the defects information storage unit 23, so that the information processing unit 24 optimizes capacitor forming positions based on the stored information. Next, when defects still remain in capacitor-cell forming positions irrespective of optimization of the positioning of a mask based on optimized capacitor-cell forming positions, the capacitor producing device 20 locally removes detects by etching with the etching unit 22.

In any one of the capacitor producing devices 20, the defects detector 21 is not necessarily limited in configuration; hence, it is possible to employ an optical inspection method, but it is preferable to specify positions of defects such as short-circuits in accordance with a resistance variation measurement method adopting OBIRCH analysis. Additionally, the etching unit 22 is not necessarily limited in configuration, wherein it is preferable to employ laser processing. Although these devices can be utilized to detect and remove defects after the formation of capacitor cells, it is preferable to repair defects on a wafer owing to a reduced time of processing.

The present embodiment makes it possible to produce non-defective capacitors in a short production time. Additionally, the present embodiment ensures local removal of defects included in thin-film capacitors on a wafer after MIM deposition; hence, it is possible to improve production yield with regard to large-area capacitors.

(Embodiment 5)

Figure 12:
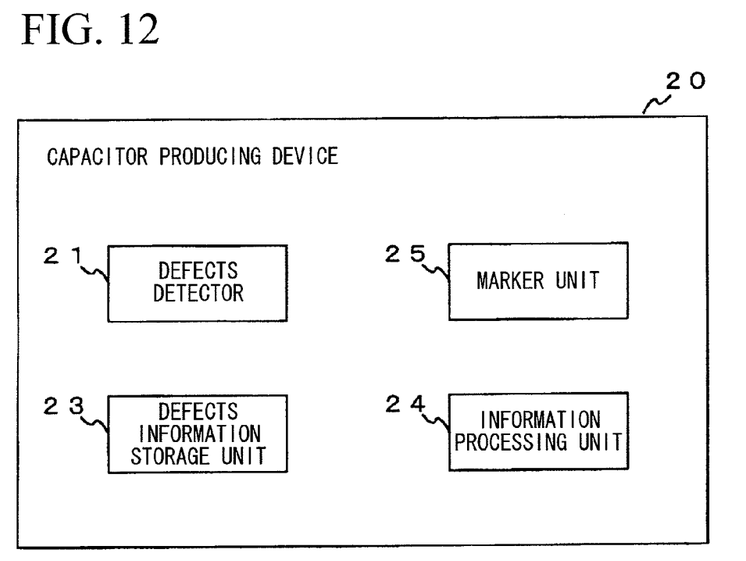
[FIG. 12] A block diagram of a capacitor producing device according to Embodiment 5 of the present invention.
Figure 13:
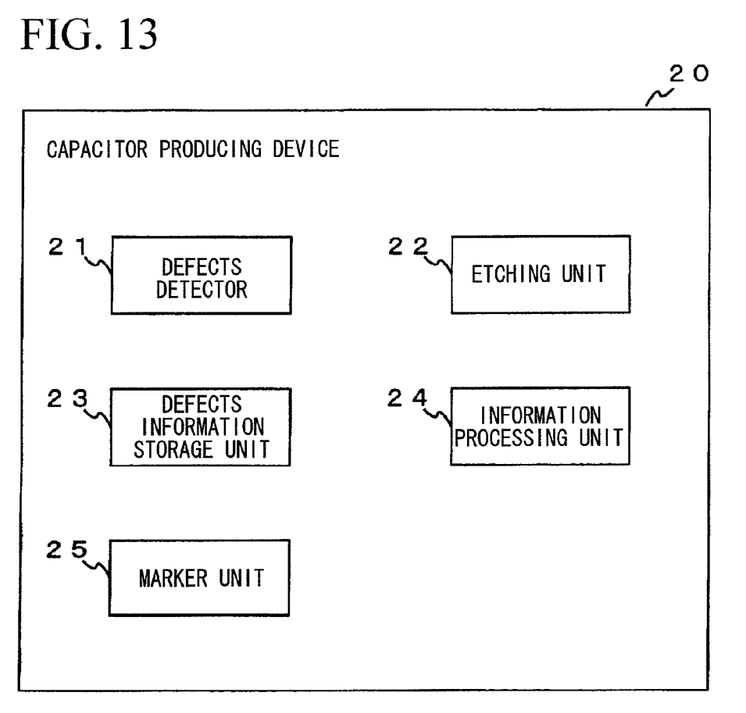
[FIG. 13] A block diagram of another capacitor producing device according to Embodiment 5 of the present invention.

FIGS. 12 and 13 show configurations of capacitor producing devices according to Embodiment 5 of the present invention. The capacitor producing device 20 shown in FIG. 12 includes the defects detector 21, the defects information storage unit 23, the information processing unit 24, and a marker unit 25. The marker unit 25 forms an alignment mark. This capacitor producing device is used to specify defects which will be formed after capacitor cells are formed on a wafer in advance and to optimize positions of capacitor cells, thus improving the yield of producing capacitors.

The capacitor producing device 20 shown in FIG. 13 further includes an etching unit 22 in addition to the constituent elements of the capacitor producing device 20 shown in FIG. 12. Thus, it is possible to remove defects, which still remain in capacitor cells after optimization of positions of capacitor cells. This further improves a yield of producing capacitor cells than that of the capacitor producing device shown in FIG. 12.

In both the capacitor producing devices 20, the defects detector 21 is not a restriction; hence, it is possible to adopt an optical inspection method, but it is preferable to specify defects such as short-circuits in accordance with a resistor variation measurement method such as OBIRCH analysis. A method of forming an alignment mark using the marker unit 25 is not a restriction; hence, it is preferable to adopt laser processing.

The present embodiment is designed to automatically optimize positions of capacitor cells based on defects of thin-film capacitors which are specified after MIM deposition on a wafer and then form an alignment mark, thus improving a yield of producing thin-film capacitors. Based on defects of thin-film capacitors which are specified after MIM deposition on a wafer, the present embodiment automatically optimizes positions of capacitor cells, forms an alignment mark, and locally removes defects inside capacitor cells, whereby it is possible to substantially eliminate defects of thin-film capacitors. Thus, it is possible to improve the yield of producing large-area capacitors on a wafer containing particles or defects such as electrical short-circuits between top electrodes and bottom electrodes.

WORKING EXAMPLE

Hereinafter, working examples will be described in detail, wherein the present invention is not necessarily limited to the working examples described below.

A 4-inch silicon wafer, in which a thermal oxidation film is formed on the surface with a 200 nm thickness, is used as the substrate 4, whilst the bottom electrode 3 is produced by sequentially depositing Ti and Ru on the wafer via DC magnetron sputtering at a room temperature. Thicknesses of films composed of Ti and Ru are set to 50 nm and 100 nm respectively. Subsequently, $SrTiO_3$(STO), added with 5% of Mn, is subjected to RF sputtering at 400° C., thus depositing the thin-film dielectric 2 with a 100 nm thickness. Next, Ru is subjected to DC magnetron sputtering at a room temperature, thus depositing the top electrode 1 with a 100 nm thickness. Herein, the room temperature indicates the temperature of a room in which no machine is driven.

Next, the top electrode 1 and the thin-film dielectric 2 are each etched with a size of 1 $mm^2$ on a wafer edge, thus forming a probing terminal. Additionally, probing and OBIRCH analysis are performed on a gap between the bottom electrode 3 and the top electrode 1 on the entire surface of a wafer so as to specify short-circuits between the bottom electrode 3 and the top electrode 1, thus locally removing specified short-circuits using laser. It is considered that particles may exist in short-circuits, whereas removal of the top electrode 1 and the thin-film dielectric 2 and damage of the bottom electrode have been confirmed by observation after laser processing. Laser processing is performed on eighteen points. Resistance measurement is conducted again between the bottom electrode and the top electrode after laser processing, whereby it is confirmed that short-circuits are eliminated from the entire surface of a wafer.

Sixteen capacitor cells with a size of 15 $mm^2$ are produced using capacitors after laser processing. As a result, it is confirmed that capacitors cells have a high capacitance ranging from 9 μF to 3.1 μF.

Figure 14:
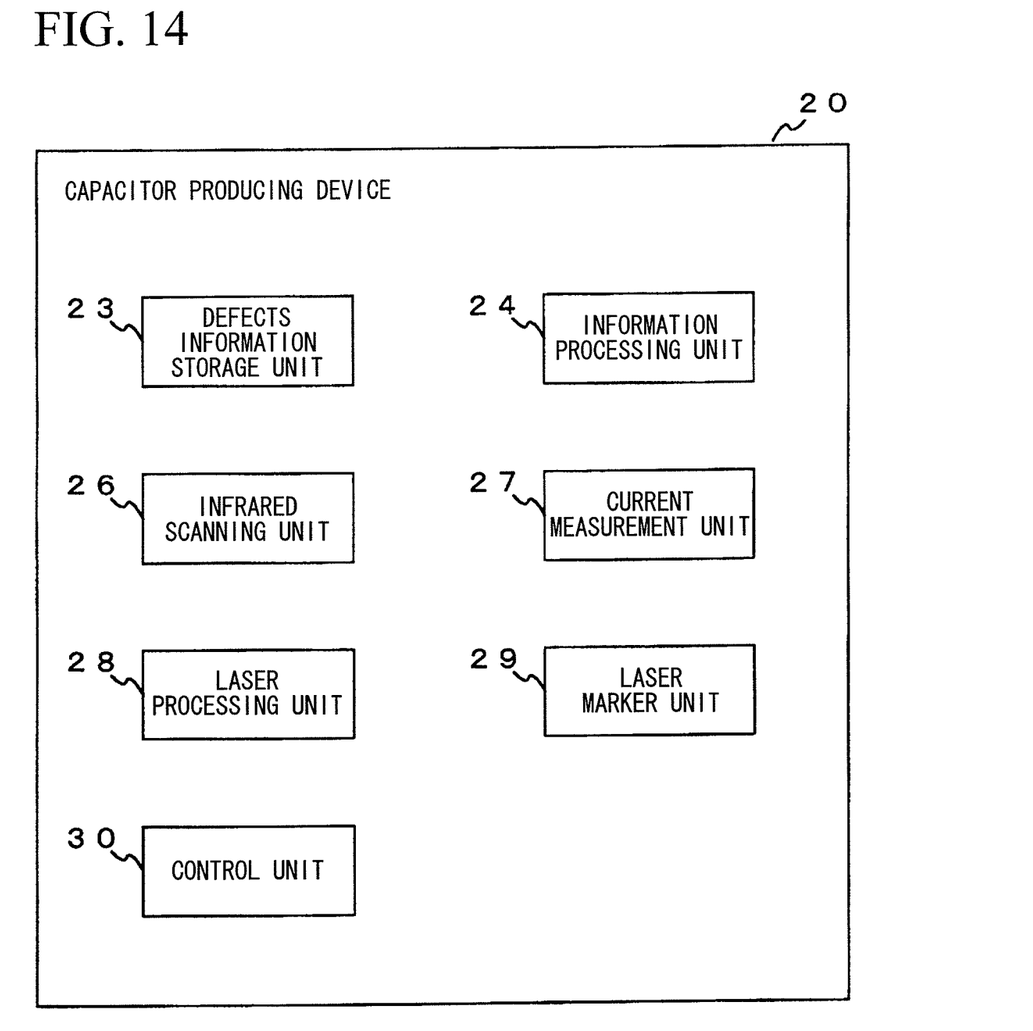
[FIG. 14] A block diagram of a capacitor producing device according to a further embodiment of the present invention.

With reference to FIG. 14, the capacitor producing device 20 includes the defects information storage unit 23, the information processing unit 24, an infrared scanning unit 26, a current measurement unit 27, a laser processing unit 28, a laser marker unit 29, and a control unit 30. As the defects detector 21 included in the capacitor producing device illustrated in FIG. 13, the capacitor producing device 20 adopts the OBIRCH analysis. The MIM deposition, equivalent to the MIM deposition employed in the foregoing embodiments, is performed on a 4-inch wafer, which is then subjected to alignment optimization and defect repairing by use of the device shown in FIG. 14. As a result, the OBIRCH analysis detects fifteen short-circuits, whilst laser processing is performed on two points in order to optimize positions of capacitor cells and repair detects, wherein an alignment mark is formed using a laser marker after optimization of positions of capacitor cells.

Next, similar to the foregoing embodiments, sixteen capacitor cells with a size of 15 $mm^2$ are produced using an alignment mark. As a result, it is possible to eliminate defective cells and produce capacitor cells whose capacitance ranges from 3.0 μF to 3.1 μF.

In this working example, the capacitor producing device 20 includes the infrared scanning unit 26 and the current measurement unit 27 collectively serving as the defects detector 21, the laser processing unit 28 serving as the etching unit 22, and the laser marker unit 29 serving as the marker unit 25. This working example is designed to produce capacitor cells such that the control unit 30 controls the defects information storage unit 23, the information processing unit 24, the infrared scanning unit 26, the current measurement unit 27, the laser processing unit 28, and the laser marker unit 29; but this is not a restriction.

In this connection, the processing of flowcharts shown in drawings can be implemented using a program with a CPU. As a computer-readable recording medium storing this program, it is possible to employ a semiconductor storage device or an optical/magnetic storage device. This program and recording medium can be implemented using a system whose configuration differs from configurations of the foregoing embodiments, wherein its CPU executes the program so as to achieve substantially the same effects as the present invention.

Heretofore, preferred embodiments have been described in details, whereas the present invention is not necessarily limited to the foregoing capacitor producing methods, capacitor producing devices, programs and recording media; hence, it is needless to say that various modifications can be implemented without departing from the scope of the invention.

This application claims priority on Japanese Patent Application No. 2009-42210 filed Feb. 25, 2009, the entire content of which is incorporated herein by reference.

Industrial Applicability

The present invention is applicable to production of capacitors using tin-film capacitors, wherein it is possible to produce thin-film capacitors with a good production yield.

Description of the Reference Numerals

1 Top electrode
2 Thin-film dielectric
3 Bottom electrode
4 Substrate
6 Short-circuit
7 Capacitor-chip peripheral position
8 Predetermined position of a capacitor
9 Predetermined position of an alignment mark
10 Capacitor-chip peripheral position 11 Capacitor forming position
12 Alignment mark
13 Defect
14 MIM deposition wafer
20 Capacitor producing device
21 Defects detector
22 Etching unit
23 Defects information storage unit
24 Information processing unit
25 Marker unit
26 Infrared scanning unit
27 Current measurement unit
28 Laser processing unit
29 Laser marker unit
30 Control unit
100 Substrate
110 Support member
120a, 120b Through-hole
140 Bottom electrode
160 High dielectric film
180 Top electrode
200 Protective film
220 Protective film
210a, 210b Electrode pad
240a, 240b Electrode pad
280a, 280b Bump electrode

The invention claimed is:

1. A capacitor producing method comprising:
forming a capacitor by depositing a bottom electrode, a thin-film dielectric, and a top electrode on a substrate;
detecting defects, including particles and electrical short-circuits between the bottom electrode and the top electrode, before dividing the capacitor into a plurality of capacitor cells;
storing defects information representing the defects detected by the defect detecting operation; and
removing the defects.

2. The capacitor producing method according to claim 1, wherein the defect detecting operation performs laser scanning on the entire surface of the substrate so as to detect the defects by way of resistance variation measurement between the bottom electrode and the top electrode.

3. A capacitor producing method comprising:
forming a capacitor by depositing a bottom electrode, a thin-film dielectric, and a top electrode on a substrate;
detecting defects, including particles and electrical short-circuits between the bottom electrode and the top electrode, before dividing the capacitor into a plurality of capacitor cells;
adjusting capacitor cell positions indicating positions of the capacitor cells; and
removing the defects.

4. The capacitor producing method according to claim 3 further comprising:
forming a mark which is used to align the capacitor cells at the capacitor cell positions adjusted by the capacitor cell position adjusting operation.

5. The capacitor producing method according to claim 4, wherein the mark forming operation forms the mark by way of laser processing.

6. The capacitor producing method according to claim 3, wherein the defect removal operation removes the defects which still remain in the capacitor cells after adjusting the capacitor cell positions.

7. The capacitor producing method according to claim 3, wherein the capacitor cell position adjusting operation adjusts the capacitor cell positions so as to minimize the number of defects included in the capacitor cells.

8. A capacitor producing method comprising:
forming a capacitor by depositing a bottom electrode, a thin-film dielectric, and a top electrode on a substrate;
detecting defects, including particles and electrical short-circuits between the bottom electrode and the top electrode, before dividing the capacitor into a plurality of capacitor cells; and
removing the defects the defects by way of laser processing.

* * * * *